United States Patent [19]
Tsang

[11] Patent Number: 5,563,438
[45] Date of Patent: Oct. 8, 1996

[54] RUGGED CMOS OUTPUT STAGE DESIGN

[75] Inventor: Joseph C. Tsang, Ellicott City, Md.

[73] Assignee: AlliedSignal Inc., Morris Township, N.J.

[21] Appl. No.: 329,753

[22] Filed: Oct. 26, 1994

[51] Int. Cl.$^6$ ................................................ H01L 23/62
[52] U.S. Cl. .......................... 257/355; 257/357; 257/373
[58] Field of Search ................................. 257/373, 328, 257/356, 357, 355, 343, 401

[56] References Cited

U.S. PATENT DOCUMENTS

| | | | |
|---|---|---|---|
| 4,607,274 | 8/1986 | Yoshitake | 257/357 |
| 4,723,081 | 2/1988 | Akatsuka . | |
| 4,847,522 | 7/1989 | Fuller et al. . | |
| 4,871,927 | 10/1989 | Dallavalle . | |
| 4,920,445 | 4/1990 | Jun | 257/356 |
| 4,922,367 | 5/1990 | Hidaka . | |
| 5,051,860 | 9/1991 | Lee et al. . | |
| 5,159,518 | 10/1992 | Roy . | |
| 5,212,616 | 5/1993 | Dhong et al. . | |
| 5,270,565 | 12/1993 | Lee et al. . | |
| 5,281,841 | 1/1994 | Van Roozendaal et al. . | |
| 5,416,351 | 5/1995 | Ito et al. | 257/357 |

FOREIGN PATENT DOCUMENTS

| | | | |
|---|---|---|---|
| 62-141754 | 6/1987 | Japan | 257/355 |
| 1-155662 | 6/1989 | Japan | 257/328 |
| 3-73568 | 3/1991 | Japan | 257/355 |

OTHER PUBLICATIONS

*Snap–Back: A Stable Regenerative Breakdown Mode of MOS Devices;* A. Ochos, Jr., et al. IEE Transactions on Nuclear Science, vol. NS–30, No. 6, Dec. 1983.
*Improvement of Latchup Hardness by Geometry and Technology Tuning,* Carlos Mazure, et al., IEE Transactions on Electron Devices, vol. 35, No. 10, Oct. 1988.
*Improved IGBTs With Fast Switching Speed and High–Current Capability,* A. M. Goodman, et al., Harris Semiconductor–APP Note; No. 8603.1 May 1992.
*IGBT Characteristics and Applications,* S. Clemente, et al., IGBT Designer's Manual 1991.
*Semiconductor Power devices,* S. Ghandhi, Wiley–Interscience, Jun., 1977, pp. 1–91.

*Primary Examiner*—Sara W. Crane
*Assistant Examiner*—Courtney A. Bowers
*Attorney, Agent, or Firm*—John R. Rafter

[57] ABSTRACT

A rugged MOS output stage transistor having a third region formed adjacent to the drain region on the side opposite the source. The third region is doped to have a polarity opposite the drain and forms in combination with the drain an output protect diode which renders the transistor relatively free of latch-up. The concept of the third region of opposite polarity adjacent to the drain may be used in both NMOSFET and PMOSFET as well as CMOS output stages.

5 Claims, 4 Drawing Sheets

RUGGED CMOS OUTPUT STAGE DESIGN

TECHNICAL FIELD

The invention is related to the field of MOS transistors and in particular to a rugged CMOS output stage design.

BACKGROUND ART

In conventional CMOS designs, snap-back and latch-up mechanisms have always been an operational concern. The snap-back mechanism is discussed by Ochoaw Jr. et al in their paper *Snap-Back: A Stable Regenerative Breakdown Mode For MOS Devices*, IEEE TRANSACTIONS ON NUCLEAR SCIENCE, Vol. NS-30 No. 6, December 1983; Lee et al in U.S. Pat. No. 5,270,565. The latch-up mechanism is discussed by Mazure et al in their paper *Improvement Of Latch-Up Hardness By Geometry And Technology Tuning*, IEEE TRANSACTIONS ON ELECTRON DEVICES, Vol. 35, No. 10, October 1988; by Hidaka in U.S. Pat. No. 5,212,616. Both snap-back and latch-up, if triggered and left unchecked, will cause irreversible damage to circuit as well as to the component itself.

Snap-back and latch-up exist in CMOS components due to the existence of parasitic bipolar transistors. To illustrate the first scenario of snap-back, a conventional NMOS transistor 10 is depicted in FIG. 1. The transistor 10 has a P-well 12 formed in a silicon layer 14, an n+ drain region 16, p+ well region 18 and an n+ source region 20 formed in the P- well 12 and a gate 22. The gate 22 may be a metal or polysilicon insulated from the upper surface of the silicon substrate 12 by an insulator layer 24.

The hole current, h, generated by an external stimulus near the drain junction seeks the nearest p+ region 18 because the p+ region 18 is at the lowest hole potential. In the NMOS circuit, this lowest potential is provided by the $V_{ss}$ supply as indicated. The external stimulus may be breakdowns caused by overvoltage transients, electrostatic discharge (ESD) light excitation or other unpredictable occurrences.

A superimposed parasitic npn transistor 26, as shown in FIG. 2, will be turned on if the hole current h is large enough to generate a potential difference of over 0.5 volts across the n+/p-well junction AA'. This action is regenerative because more electrons (e) will be injected from the n+ source region 20 to render yet more holes to be supplied from the impact ionization in the source-well depletion region DD'. Once triggered, this parasitic current will create local hot spots. If the intrinsic temperature of the silicon layer is exceeded, the formation of mesoplasmas will eventually cause the surrounding material to melt. The NMOS transistor will be destroyed unless the transistor goes through a power down cycle. The prior art cited above teaches additional circuit components that can be designed into an integrated circuit to detect a current surge and initiate a power down cycle.

In latch-up, on the other hand, an NMOS transistor 28 and a PMOS transistor 30 are involved as shown on FIGS. 3 and 4.

The NMOS transistor 28 consists of a P-well 32 formed in a silicon substrate and further has an n+ drain region 34, an n+ source region 36, a p+ well region 38 adjacent to the n+ source region 36 and a gate 40 formed on an insulating layer 42. The PMOS transistor 30 has an n– well 44 formed in the silicon substrate and further has a p+ drain region 46, a p+ source region 48, an n+ well region 50 adjacent to the p+ source region 48, and a gate 52 provided on top of an insulating layer 54.

In the NMOS transistor 28, the stray hole current (h) generated by an overvoltage, overcurrent, a rapid change in voltage (dv/dt), excessive ambient temperature, or a combination of some or all of these conditions, will seek the nearest p+ region such as p+ well 38. This is illustrated by the superimposed circuit in which the hole current (h+) flows from the P– well 32 through a resistance RW1 past point A, through a resistance RP to a point C in the p+ well region 38. Again, when the voltage between point A and a point A' in the n+ source region 36 exceeds 0.5 volts, a parasitic npn transistor 56 will be formed as shown in FIG. 4. The stray electron current (e–) generated in the n–well 44 by an overvoltage, overcurrent, a rapid change in voltage (dv/dt) excessive ambient temperature or a combination of some or all of these conditions will seek the nearest n+ region and in particular n+ well region 50. This is illustrated by the superimposed circuit in which the electrons flow from the n–well 44 through a resistance RW2 past point B, through resistance RN to the n+ well region 50 illustrated by point F. Again, when the voltage between point B and the p+ source region 49 illustrated as point B' exceeds 0.5 volts a thyristor 58 will be formed. If the reverse bias at the two junctions formed by points AA' and BB' is greater than 0.5 volts, a regenerative action, called latch-up, involving parasitic thyristors 56 and 58 will occur and the destruction of the CMOS device comprising NMOS transistor 28 and PMOS transistor will soon follow.

The rugged output stage structure of this invention improves the snap-back and latch-up thresholds beyond the full power supply voltage range and will only slightly increase the size of the stage structure.

SUMMARY OF THE INVENTION

The invention is a rugged transistor output stage having a well of a first polarity formed in a semiconductor substrate. A source region is provided in the well highly doped with a dopant of the opposite polarity. A drain region is provided in said well spatially separated from the source region. The drain region is highly doped with a dopant of the second polarity. A gate is provided on the surface of said substrate intermediate the source region and the drain region. A third region is provided in said well adjacent to the drain region on the side opposite the source region. The third region having a higher doping density of the first type of dopant than the well. The third region, in conjunction with the drain region, form an output protect diode which increases the electrostatic discharge/avalanche capabilities and the voltage rate of change (dv/dt) ratings of the transistor.

In the preferred embodiment, the source region consists of alternating $P^+$ and $N^+$ subregions to reduce snap-back and further enhance the ruggedness of the MOS output stage transistor. The use of the third region to provide an output protection diode on the side of the drain opposite the gate of a MOSFET can be extended to complementary MOS output devices.

One advantage of the rugged MOS output transistor is that it is relatively free of snap-back and latch-up.

Another advantage of the rugged MOS output transistor is that the concept can be extended to transistors having high rail-to-rail voltages.

Another advantage of the rugged MOS output transistor is that the concept can be applied to both NMOSFETs and PMOSFETs.

Yet another advantage is that only a minimal number of steps in addition to the normal number of steps are required to ruggedize an output transistor.

These and other advantages will become more apparent from a reading of the specification in conjunction with the drawings.

BEST MODE FOR CARRYING OUT THE INVENTION

Figure 1:
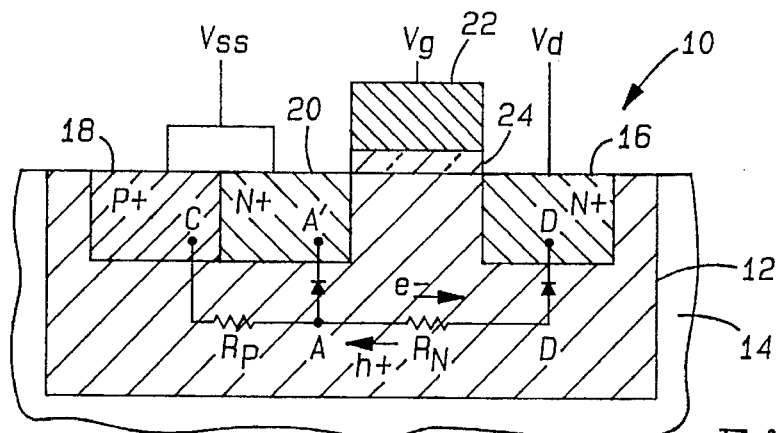
FIG. 1 is a cross-sectional view of a prior art MOSFET output transistor.
Figure 2:
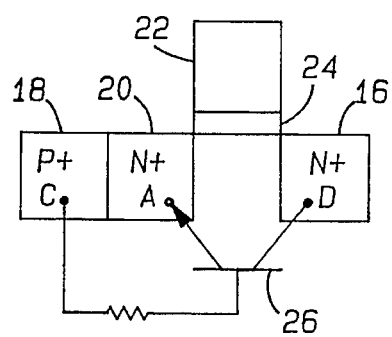
FIG. 2 illustrates the parasitic transistor formed during breakdown super-imposed on the transistor of FIG. 1;.
Figure 3:
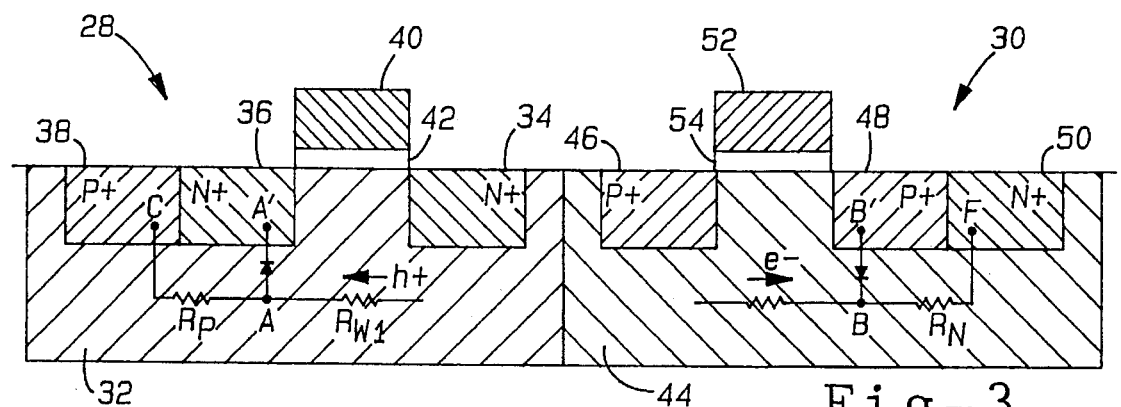
FIG. 3 is a cross-sectional view of a CMOS output transistor.
Figure 4:
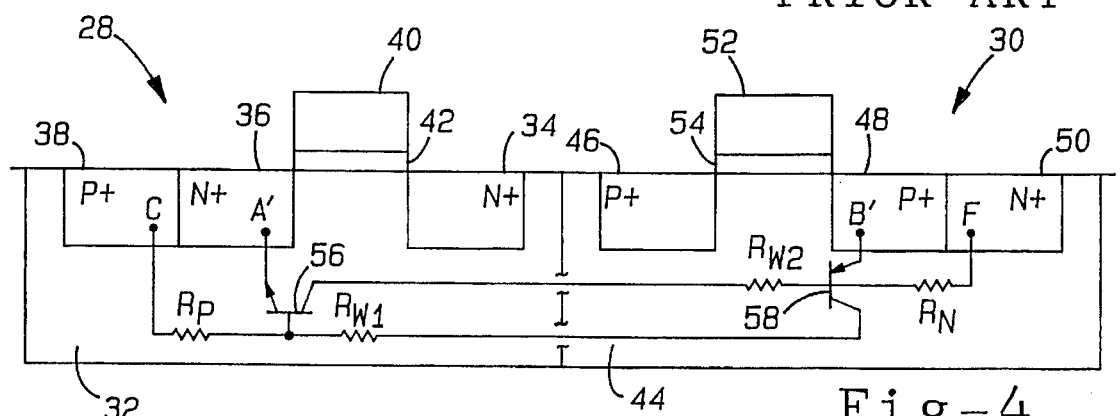
FIG. 4 illustrates the parasitic transistors formed during breakdown super-imposed on the CMOS transistor of FIG. 3.
Figure 5:
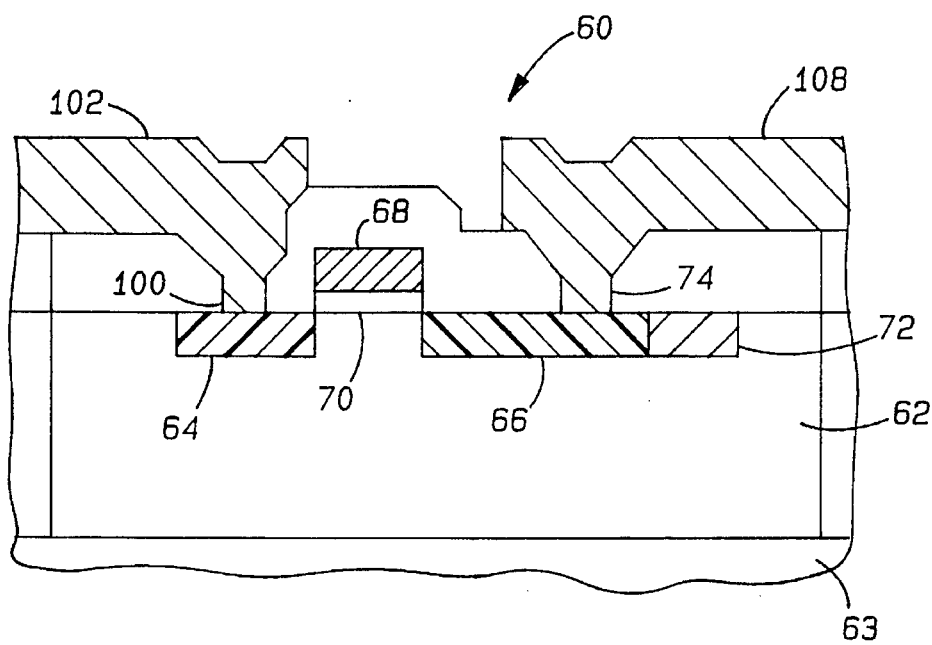
FIG. 5 is a cross-section of an output stage NMOSFET incorporating the invention.
Figure 6:
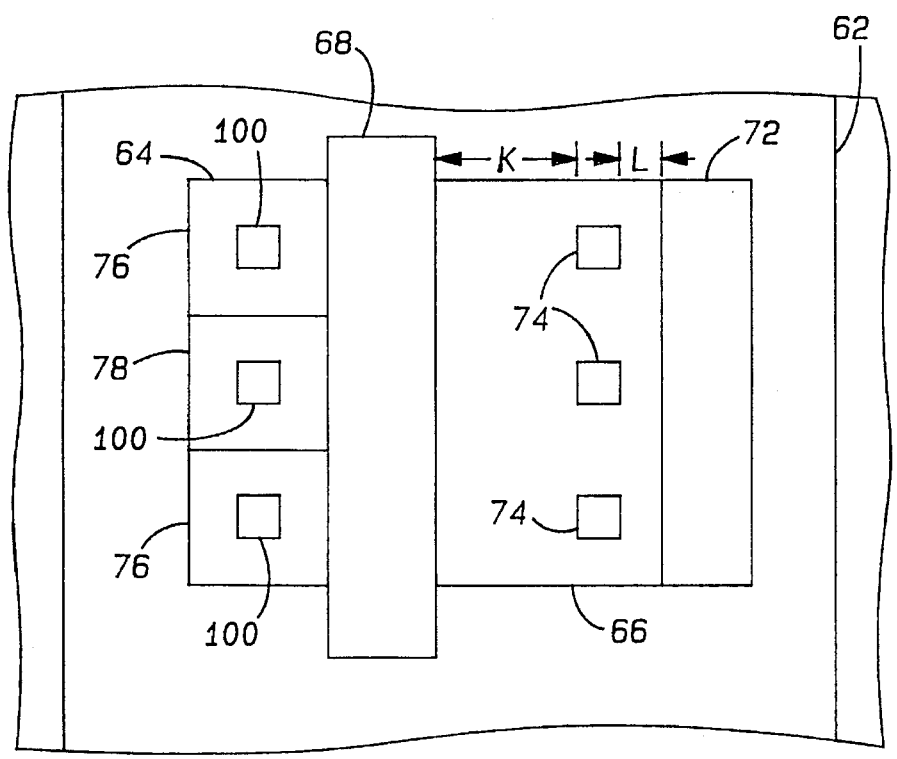
FIG. 6 is a top view of the NMOSFET shown in FIG. 5.

The details of a rugged output stage are shown in FIGS. 5 and 6. These figures depict an NMOSFET output stage transistor 60 formed in a P-well region 62 of a substrate 63. The substrate may be a conventional bulk silicon, silicon on insulator (SOI) or silicon on sapphire (SOS) substrate. The output stage transistor 60 has a source region 64, an $N^+$ drain region 66 and a gate 68 disposed intermediate the source and drain regions. The gate 68 may be a metal or polysilicon layer deposited on a thin insulating layer 70 such as a silicon dioxide layer formed on the surface of the P– well 62.

A P region 72, having a higher doping density than the surrounding P–well region 62 is formed adjacent to the $N^+$ drain region 66 on the side opposite the source 64. The P region 72, in combination with the $N^+$ drain region, forms an output protect diode which increases the electrostatic discharge/avalanche capability and the dv/dt rating of the output stage. The higher P-type doping density of the P region 72 will reduce the breakdown threshold of the junction between the $N^+$ drain region 66 and the P region 72 to a value lower than the breakdown threshold of the drain junction in the region adjacent to the gate 68. This higher doping of the P region 72 can be tailored such that the breakdown voltage is as low as 5.3 V (Zener voltage) or as high as the drain diode breakdown voltage.

In the former case, an opening in the photoresist above the P region 72 permits P-type ion implantation in that region at the same time as the P source/drain implant as shall be discussed hereinafter. Therefore, this ion implantation of the P region does not require a special mask. However, for a breakdown threshold intermediate the Zener voltage and the drain diode breakdown voltage, an addition mask and a separate implantation will be required for the P-type ion implantation of the P region 72. This additional ion implant gives greater flexibility and permits the fabrication of output stages having higher rail-to-rail voltages than the 5 V rail-to-rail voltage applications obtained in the former case requiring no additional mask or implantation.

Returning to FIG. 6, electrical contact to the $N^+$ drain region is made by a series of metal contacts 74 arranged along a line parallel to the gate 68. The metal contacts 74 are displaced a distance K from the edge of the gate 68 and a distance L from the junction between the $N^+$ drain region 66 and the P region 72. The ratio between the distances K and L is critical to the proper operation of the output protect diode. The ratio of the spacings K and L (i.e. K/L) must be greater than unity, so that the avalanche action initiated by electrostatic discharge, overvoltage transients, light excitation, or other unpredictable occurrences, will occur preferentially at the P region 72 rather than in the vicinity of the N-type drain region 66 closer to the gate. The metal contacts are connected to each other by a metal connector 108 in a conventional manner.

The source 64 of the output stage transistor 60 has alternating $N^+$ and $P^+$ subregions 76 and 78, respectively, as shown in FIG. 6. Metal contacts 100 make individual electrical contact to alternating $N^+$ and $P^+$ regions 76 and 78. The metal contacts 100 are connected to each other by a metal connector 102 as is more clearly shown in FIG. 9. This type of source configuration is known in the art and is used to reduce snap-back. The use of the alternating $N^+$ and $P^+$ regions further enhances the reliability of the CMOS output transistor.

Figure 7:
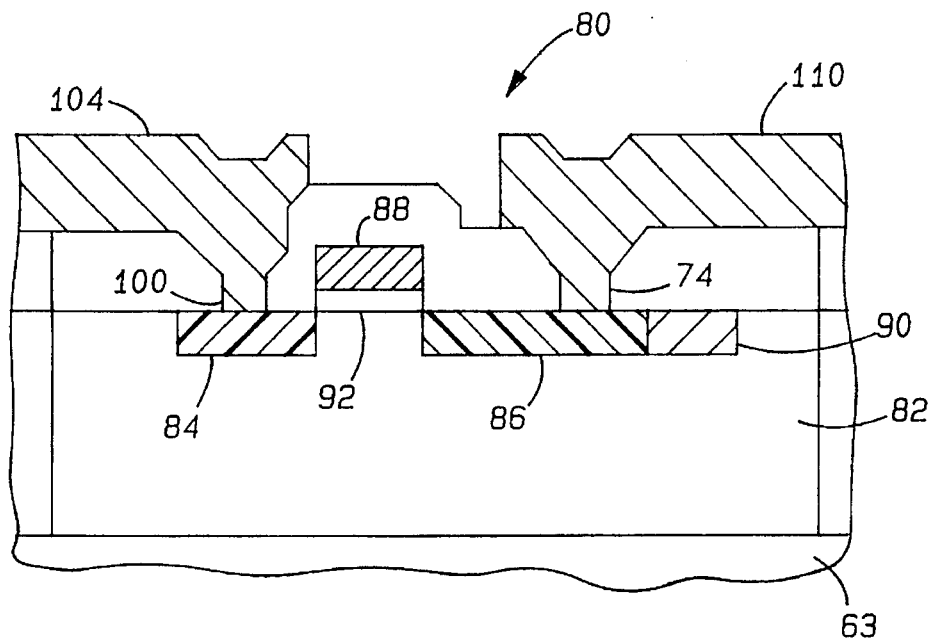
FIG. 7 is a cross-section of an output stage PMOSFET incorporating the invention.
Figure 8:
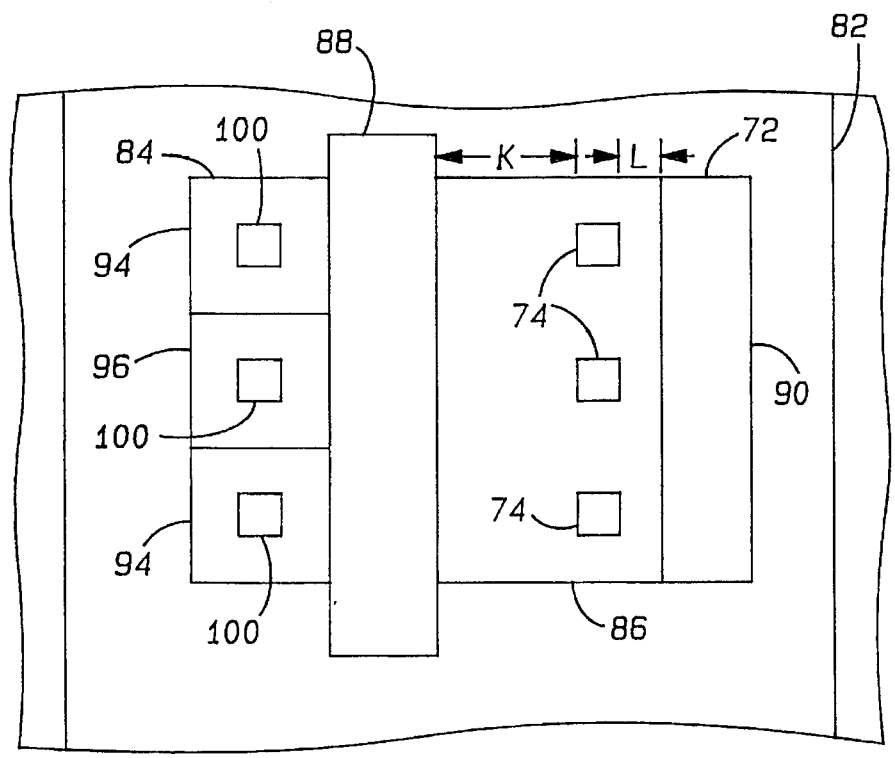
FIG. 8 is a top view of the PMOSFET shown in FIG. 7.

FIGS. 7 and 8 show a PMOSFET ruggedized output stage transistor 80. The output stage transistor 80 has an N–well 82 formed in a silicon SOI or SOS substrate, such as substrate 63, a source region 84, a $P^+$ drain region 86, a gate 88, an N region 90 having a higher doping density than the N–well 82. As in the NMOSFET output stage transistor 60, the gate 88 is a metal or polysilicon layer formed on a thin insulating layer 92 intermediate the source and drain regions. The source has alternating $P^+$ and $N^+$ subregions 94 and 96, respectively. The N region 90 is formed adjacent to the $P^+$ drain region 86 and forms, in combination with drain region 86, an output protect diode which increases the electrostatic discharge/avalanche capability and the dv/dr rating of the output stage. The alternating $P^+$ and $N^+$ subregions of the source region 84 is used to inhibit snap-back as previously described. As in the NMOSFET output stage 60 shown on FIGS. 5 and 6, electrical contacts 74 make electrical contact to the P drain region 86 at a location displaced a distance K from the gate and a distance L from the N region 90 where the distance K is greater than the distance L. The electrical contacts 74 are connected to each other by an electrical connector 110 as shown on FIG. 9. In a like manner, electrical contacts 100 make electrical contact to the alternating $P^+$ and $N^+$ subregions and are electrically connected to each other by metal connector 104 as shown in FIG. 9.

Figure 9:
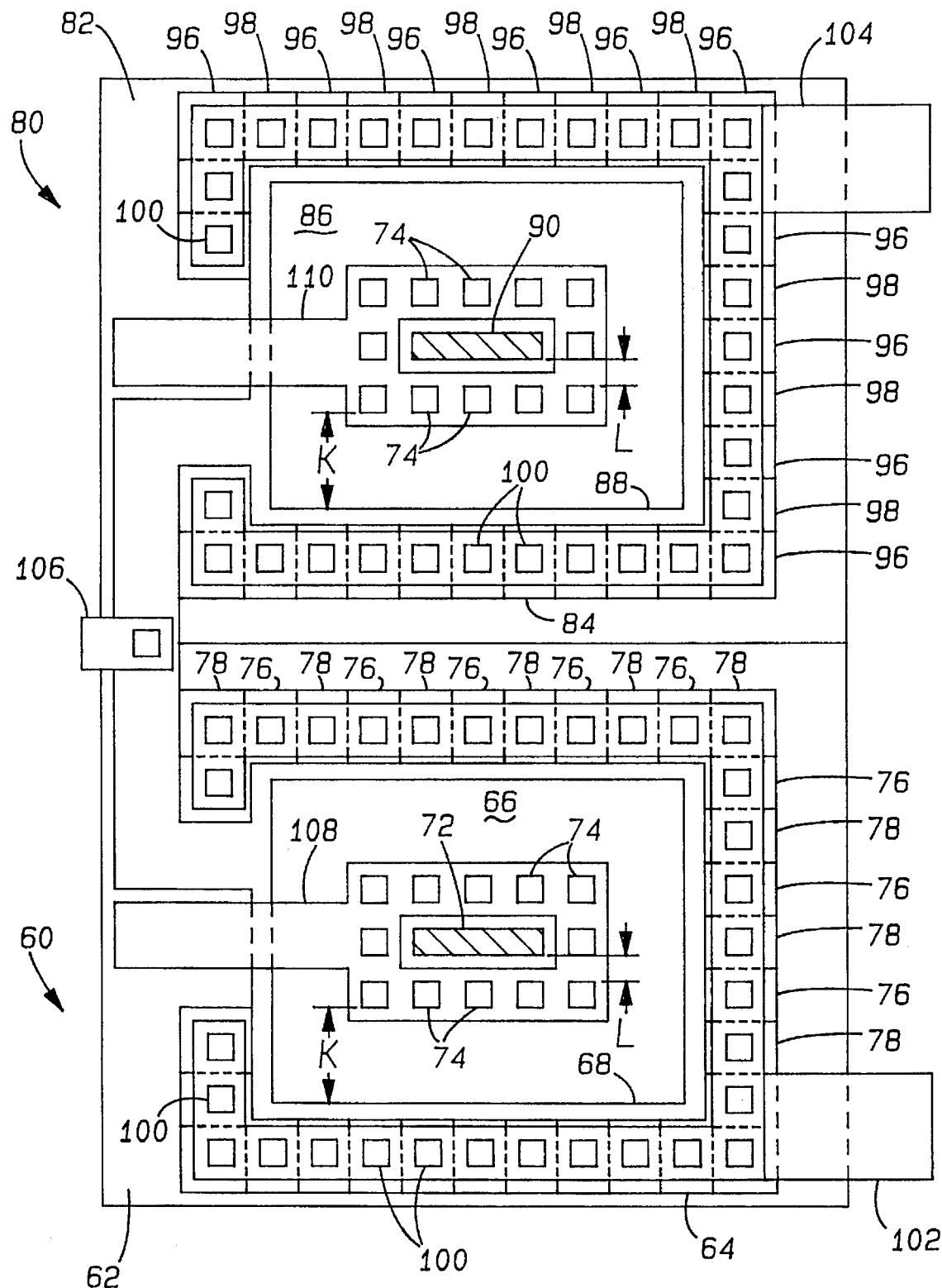
FIG. 9 is a top view of a CMOS output stage incorporating the invention.

FIG. 9 shows a complementary output stage embodying an NMOSFET transistor 60 and a PMOSFET transistor 80. The same reference numerals are used in FIG. 9 as were used in FIGS. 5 through 8 to identify the same elements and simplify the discussion. The P–well 62 of the NMOSFET transistor 60 and the N–well 82 of the PMOSFET transistor 80 are formed on a common substrate. The gate 68 of the NMOSFET transistor 60 and the gate 88 of PMOSFET transistor 80 are connected to each other and to a common electrical contact tab 106. The gate 68 of the NMOS transistor 60 has a rectangular configuration circumscribing the $N^+$ drain 66. In a like manner, the gate 88 of the PMOSFET transistor 80 has a corresponding rectangular configuration circumscribing the P⁺ drain 86. The source 64 of the NMOSFET 60 has a plurality of alternating N⁺ subregions 76 and P⁺ subregions 78 substantially circumscribing the gate 68 while the source region 84 of the PMOSFET 80 consists of a plurality of alternating P⁺ subregions 94 and N⁺ subregions substantially circumscribing the gate 88. A metal connector 102 connects the electrical contacts 100 of the N⁺ subregions 76 and the P⁺ regions 78 of the source 64. In a like manner, metal connector 104 connects the electrical contacts 100 of the P⁺ subregions 96 and the N⁺ subregions 98 of the source 84 of the PMOSFET 80.

A metal connector 108 electrically connects the electrical contacts 74 to the N⁺ drain region 66 of the NMOSFET transistor 60 while a metal connector 110 electrically connects the electrical contacts 74 to the P⁺ drain region 86 of the PMOSFET transistor 80. As in the embodiments discussed relative to FIGS. 5–8, the ratio of the distance K between the electrical contacts 74 and the gates 68 and 88, and the distance L between the electrical contacts 74 and the P region 72 and the N region 90 is greater than 1 so that an output protect diode is formed between the P⁺ drain region 86 and the N region 90 as well as between the N⁺ drain region 66 and the P region 72 as previously discussed.

It is to be recognized that although the complete CMOS output stage shown in FIG. 9 has an annular (closed) geometry the concept is equally applicable to linear (open) geometries with equal effectiveness.

Having disclosed a preferred embodiment of the rugged MOS output stage, it is recognized that those skilled in the art may make certain changes and improvements thereto within the scope of the invention set forth in the appended claims.

What is claimed is:

1. A rugged CMOS output stage comprising:

a silicon substrate;

a P well provided in said substrate;

a first source region provided in said P well;

an N⁺ drain region provided in said P well spaced from said first source;

a first gate provided on a surface of said substrate intermediate said first source region and said N⁺ drain region;

a P region provided in said P well forming a junction with said N⁺ drain region on the side opposite said first source region, said P region being more highly doped than said P well and forming in conjunction with said N⁺ drain region an output protect diode, said first source region, said first gate and said N⁺ drain region are arranged in a first annular geometry with said P region being in the center of said first annular geometry;

at least one electrical contact to said N⁺ drain region located at a distance K from said first gate and at a distance L from said junction of said N⁺ drain region and said P region wherein the ratio between said distance K and said distance L is selected to cause an avalanche action to occur preferentially in said P region;

an N well provided in said substrate;

a second source region provided in said N well;

a P⁺ drain region provided in said N well spaced from said second source region;

a second gate disposed on the surface of said substrate intermediate said second source region and P⁺ drain region;

an N region provided in said N well forming a junction with said P⁺ drain region on the side opposite said second source region, said N region being more highly doped than said N well and forming in conjunction with said P⁺ drain region an output protect diode, said second source region, said second gate and said P⁺ drain region being arranged in a second annular geometry with said N region being in the center of said second annular geometry; and at least one electrical contact to said P⁺ drain region located at said distance K from said second gate and said distance L from said junction of said P⁺ drain region and said N region wherein the ratio between said distance K and said distance L is selected to cause an avalanche action to preferentially occur in said N region.

2. The rugged CMOS output stage of claim 1 wherein said first and second sources comprise alternating N⁺ and P⁺ subregions adjacent to said first and second gates, respectively.

3. The rugged CMOS output stage of claim 8 wherein said first and second sources comprise alternating N⁺ an P⁺ subregions adjacent to said first and second gates, respectively.

4. The rugged CMOS output stage of claim 1 wherein said at least one electrical contacts to said P⁺ and N⁺ drain regions respectively is a plurality of electrical contacts to said N⁺ and P⁺ drain regions located at said distance K from said gates, and located said distance L from the junction between said N⁺ drain region and said P region and from the junction between said P⁺ drain region and said N region and where said ratio of the distances K to L is greater than 1.

5. The rugged CMOS output stage of claim 3 further including a first electrical connector electrically connecting said first gate and second gate to each other and to a common input tab, a second electrical connector connecting said alternating N⁺ and P⁺ subregions of said first source to each other and to a source voltage tab, a third electrical connector connecting said N⁺ drain to an output pad, a fourth connector connecting said alternating N⁺ and P⁺ subregions of said second source to a drain voltage input tab and a fifth connector connecting said P⁺ drain region to a second output pad.

* * * * *